United States Patent
Wei

(10) Patent No.: US 8,659,899 B2
(45) Date of Patent: Feb. 25, 2014

(54) COOLING SYSTEM FOR ELECTRONIC DEVICE

(75) Inventor: Chao-Ke Wei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 174 days.

(21) Appl. No.: 13/340,684

(22) Filed: Dec. 30, 2011

(65) Prior Publication Data
US 2013/0155607 A1    Jun. 20, 2013

(30) Foreign Application Priority Data

Dec. 15, 2011    (TW) .............................. 100146443 A

(51) Int. Cl.
*H05K 7/20*    (2006.01)
*G06F 1/20*    (2006.01)

(52) U.S. Cl.
USPC ............... 361/700; 361/679.47; 361/679.48; 361/679.52; 361/695; 361/696; 361/701; 361/715

(58) Field of Classification Search
USPC ............ 361/679.47–679.48, 679.5, 679.52, 361/694–697, 698, 700–701, 704; 62/259.2, 498
See application file for complete search history.

(56) References Cited

U.S. PATENT DOCUMENTS

| | | | | |
|---|---|---|---|---|
| 4,467,861 A * | 8/1984 | Kiseev et al. | ............ | 165/104.22 |
| 4,515,209 A * | 5/1985 | Maidanik et al. | ........ | 165/104.22 |
| 5,657,641 A * | 8/1997 | Cunningham et al. | .......... | 62/263 |
| 6,418,018 B1 * | 7/2002 | Lo | ................. | 361/700 |
| 6,493,223 B1 * | 12/2002 | Viswanath et al. | ........... | 361/690 |
| 7,281,389 B1 * | 10/2007 | O'Brien et al. | ................. | 62/272 |
| 7,457,116 B2 * | 11/2008 | Erturk et al. | .................. | 361/696 |
| 7,852,627 B2 * | 12/2010 | Schmitt et al. | ................ | 361/695 |
| 8,347,640 B2 * | 1/2013 | DeMonte et al. | ................. | 62/93 |
| 2006/0028800 A1 * | 2/2006 | Chrysler et al. | .............. | 361/700 |
| 2009/0310300 A1 * | 12/2009 | Chrysler | ........................ | 361/691 |
| 2013/0083482 A1 * | 4/2013 | Uchida et al. | ................. | 361/696 |

FOREIGN PATENT DOCUMENTS

CN    202769832 U *   3/2013    ................ F24F 1/00

* cited by examiner

*Primary Examiner* — Robert J Hoffberg
(74) *Attorney, Agent, or Firm* — Altis Law Group, Inc.

(57) ABSTRACT

A cooling system is used for cooling an electronic apparatus in an electronic device. The electronic device includes a top wall, a bottom wall, a first sidewall, and a second sidewall. The electronic apparatus is supported on a middle of the bottom plate. The cooling system includes an evaporator, a fan, a condenser, a heat sink attached to the condenser, and a refrigerant pipe connected between the condenser and the evaporator. The heat sink and the condenser are set on an inner surface of the first sidewall. The fan is set on the first sidewall and aligns with the heat sink. The condenser operates to cool refrigerant and transfers the cooled refrigerant to the evaporator. A first airflow cooled by and coming from the evaporator flows through the electronic apparatus and the condenser to cool the electronic apparatus and the condenser, and is then vented through the fan.

5 Claims, 1 Drawing Sheet

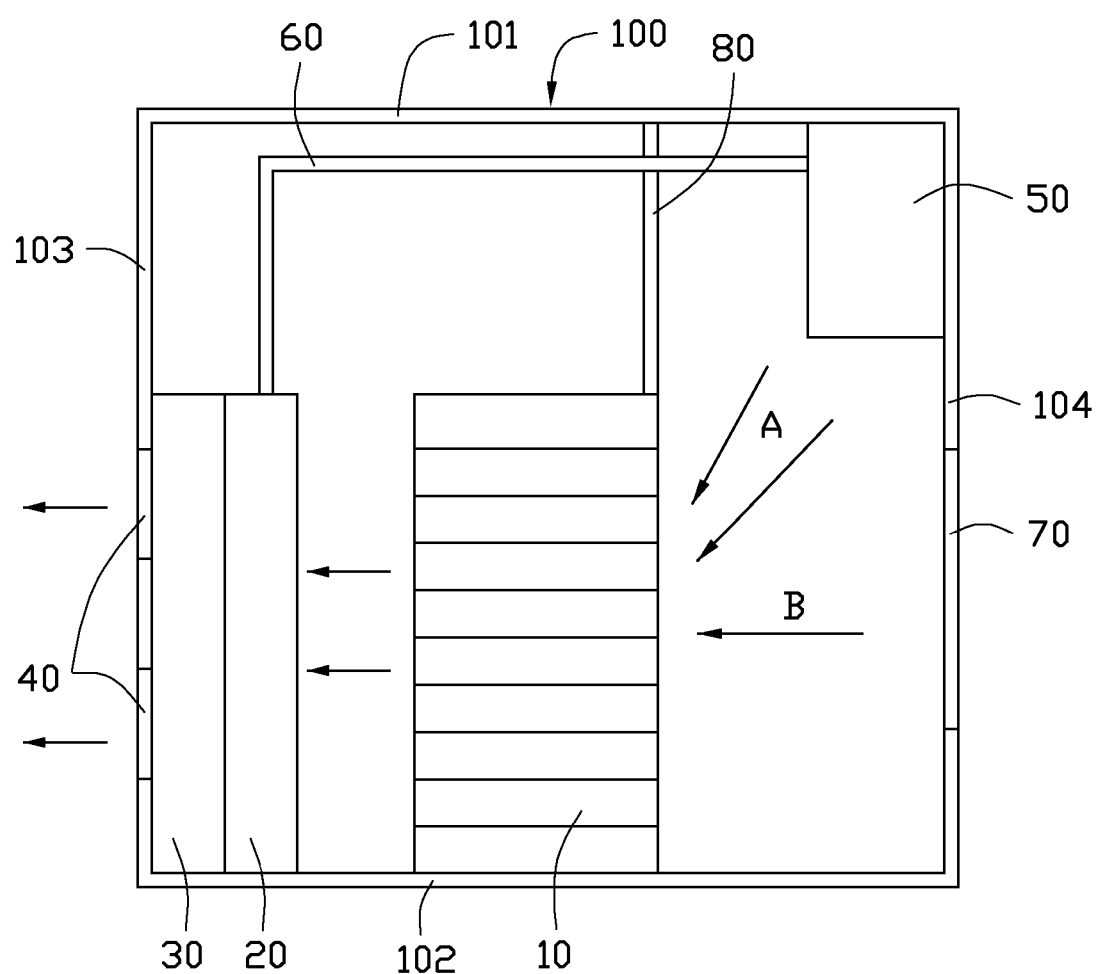

COOLING SYSTEM FOR ELECTRONIC DEVICE

BACKGROUND

1. Technical Field

The present disclosure relates to cooling systems, and particularly, to a cooling system for an electronic device.

2. Description of Related Art

With increasing use of online applications, the need for computer data centers has increased rapidly. Data centers are centralized computing facilities that include many servers, often arranged on server racks or shelves, and one rack or shelf with several servers can be considered as a server system. During operation, server systems generate a great amount of heat in the data centers, and a common method for dissipating the heat is to use of air conditioners and of fans, which leads to energy waste.

BRIEF DESCRIPTION OF THE DRAWING

Many aspects of the present embodiments can be better understood with reference to the following drawing. The components in the drawing are not necessarily drawn to scale, the emphasis instead being placed upon clearly illustrating the principles of the present embodiments. Moreover, in the drawing, like reference numerals designate corresponding parts throughout the several views.

The FIGURE is a schematic, plan view of a cooling system of an electronic device, according to an exemplary embodiment.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

Referring to the FIGURE, an embodiment of a cooling system is provided for cooling an electronic apparatus 10 arranged in an electronic device 100. The electronic device 100 includes a top wall 101, a bottom wall 102 opposite to the top wall 101, and a first sidewall 103 and a second sidewall 104 connected between corresponding ends of the top wall 101 and bottom wall 102. The electronic apparatus 10 is supported on a middle of the bottom wall 102. In the embodiment, the electronic device 100 is a container data center. The electronic apparatus 10 is a rack server, which can generate a great amount of heat. In other embodiments, the electronic device 100 may be a rack server, and the electronic apparatus 10 may be a plurality of server modules.

The cooling system includes a condenser 20, a heat sink 30, a plurality of fans 40, an evaporator 50, and a refrigerant pipe 60 connected between the condenser 20 and the evaporator 50. The heat sink 30 is attached to the condenser 20. The heat sink 30 and the condenser 20 are set on an inner surface of the first sidewall 103. The fans 40 are set on the first sidewall 103 and aligned with the heat sink 30. The evaporator 50 is set on the top wall 101 adjacent to the second sidewall 104. In other embodiments, the evaporator 50 may be set on a top of the electronic apparatus 10.

The second sidewall 104 defines a plurality of through holes 70.

An adiabatic plate 80 is arranged between the top of the electronic apparatus 10 and the top wall 101.

When the electronic device 100 operates, the condenser 20 operates to cool the refrigerant and transfers the cooled refrigerant to the evaporator 50 through the refrigerant pipe 60. The cooled airflow A cooled by and coming from the evaporator 50 flows through the electronic apparatus 10 and the condenser 20 to cool the electronic apparatus 10, the condenser 20, and the heat sink 30, and is then vented through the fans 40.

When the electronic apparatus 10 is not too hot, the condenser 20 and the evaporator 50 will not operate. The airflow B coming from the through holes 70 flows through the electronic apparatus 10 and the condenser 20 to cool the electronic apparatus 10, the condenser 20, and the heat sink 30, and is then vented through the fans 40.

In these embodiments, the fans 40 are used to vent heat not just for the condenser 20, but also for the electronic apparatus 10, which reduces fan usage and saves energy.

Even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. An electronic device, comprising:
   a top wall;
   a bottom wall opposite to the top wall;
   a first sidewall;
   a second sidewall opposite to the first sidewall;
   an electronic apparatus being supported on a middle of the bottom wall;
   an evaporator set on an inner surface of the top wall adjacent to the second sidewall;
   a condenser;
   a heat sink attached to the condenser, wherein the heat sink and the condenser are set on an inner surface of the first sidewall adjacent to the bottom wall, wherein the heat sink is located between the first sidewall and the condenser;
   a fan set on the first sidewall and aligning with the heat sink; and
   a refrigerant pipe connected between the condenser and the evaporator;
   wherein the condenser operates to cool refrigerant and transfers the cooled refrigerant to the evaporator, a first airflow cooled by and coming from the evaporator flows through the electronic apparatus and the condenser to cool the electronic apparatus and the condenser, and is then vented through the fan.

2. The electronic device of claim 1, wherein the second sidewall defines a plurality of through holes, and a second airflow coming from the through holes flows through the electronic apparatus and the condenser to cool the electronic apparatus, the condenser, and the heat sink, and is then vented through the fan.

3. The electronic device of claim 1, wherein an adiabatic plate is arranged between a top of the electronic apparatus and the top wall.

4. The electronic device of claim 1, wherein the electronic device is a container data center, the electronic apparatus is a rack server.

5. The electronic device of claim 1, wherein the electronic device is a rack server, and the electronic apparatus is a server module.

\* \* \* \* \*